United States Patent [19]
Proebsting

[11] Patent Number: 5,740,116
[45] Date of Patent: Apr. 14, 1998

[54] CURRENT LIMITING DURING BLOCK WRITES OF MEMORY CIRCUITS

[75] Inventor: Robert J. Proebsting, Los Altos Hills, Calif.

[73] Assignee: Townsend and Townsend and Crew, LLP, San Francisco, Calif.

[21] Appl. No.: 578,885

[22] Filed: Dec. 22, 1995

[51] Int. Cl.$^6$ ........................................ G11C 7/00
[52] U.S. Cl. .................. 365/205; 365/190; 365/189.01
[58] Field of Search ........................... 365/189.01, 190, 365/205, 206, 207, 208, 230.03, 149

[56] References Cited

U.S. PATENT DOCUMENTS

| | | | |
|---|---|---|---|
| 4,823,302 | 4/1989 | Christopher | 364/900 |
| 5,274,585 | 12/1993 | Suyama | 365/149 |
| 5,276,645 | 1/1994 | Tanaka | 365/149 |
| 5,282,177 | 1/1994 | McLaury | 365/230.05 |
| 5,305,263 | 4/1994 | Morgan | 365/190 |
| 5,305,278 | 4/1994 | Inoue | 365/230.03 |
| 5,319,606 | 6/1994 | Bowen et al. | 365/230.06 |
| 5,323,349 | 6/1994 | Hamade | 365/189.01 |
| 5,517,444 | 5/1996 | Ishimura | 365/63 |

*Primary Examiner*—David C. Nelms
*Assistant Examiner*—Son Mai
*Attorney, Agent, or Firm*—Townsend and Townsend and Crew, LLP

[57] ABSTRACT

A circuit and a method for limiting current during block write operations in memory integrated circuits such as graphics or video RAMs. A bias line for all sense amplifiers located between two memory sub-arrays is divided into independent segments connected to groups of sense amplifiers. Each segment is biased by a separate sense amplifier enable transistor. With much reduced loading, each enable transistor connected to a segmented bias line is significantly smaller in size. Thus, the sense amplifier crowbar or switching current is significantly reduced when writing a block of data of opposite polarity into a block of memory cells.

20 Claims, 4 Drawing Sheets

CURRENT LIMITING DURING BLOCK WRITES OF MEMORY CIRCUITS

BACKGROUND OF THE INVENTION

This invention relates in general to memory integrated circuits, and in particular to a circuit and method for limiting the current drawn during a block write operation in memory circuits.

For certain applications memory circuits provide the capability of writing large blocks of data simultaneously. An example is random access memory (RAM) circuits used in graphics applications. A video graphics system typically uses a RAM to store data that represent the color or intensity of light for every picture cell (pixel) on the video screen. Frequently, adjacent portions of the screen display exactly the same information. To decrease the number of write cycles required to fill the memory with such data, the video RAM allows writing the same data simultaneously in multiple adjacent column addresses. The design of existing video RAMs is typically based on conventional RAM circuits adapted to perform block writes. This design, however, gives rise to large current spikes during block writes. The large current spikes add to noise and power consumption of the circuit which degrades the overall performance of the memory chip. The problem is explained in greater detail hereinafter in connection with the circuit shown in FIG. 1.

A RAM circuit is typically arranged in several identical memory arrays with each array including a matrix of memory cells located at intersections of a number of columns (or bit lines, BLs) and rows (or word lines, WLs). A 16 Meg RAM, for example, may be divided into 64 separate arrays, each array including 256K memory cells, with each cell located at each intersection of 1024 bit line pairs and 256 word lines. The 64 arrays may be arranged in one or more rows of adjacently placed arrays.

FIG. 1 shows part of the circuitry for two adjacent memory arrays for the exemplary 16 Meg RAM. A memory array 100 is made up of a matrix of 1024 pairs of complementary bit lines 102 and 256 word lines 104. Array select transistors 106 connect bit line pairs 102 to sense nodes of sense amplifiers 108. There are 1024 sense amplifiers 108 for 1024 bit line pairs 102, half of which are placed on either side of an array 100. Thus, there are 512 sense amplifiers 108 between a pair of arrays 100, connecting to 512 bit line pairs 102 in an alternating fashion. Each sense amplifier 108 includes a pair of cross-coupled PMOS transistors 110 connected to a pair of cross-coupled NMOS transistor 112 that sense and amplify the voltage on the associated pair of bit lines 102. Cross-coupled PMOS transistors 110 connect to a bias line Pbias 114 and cross-coupled NMOS transistors 112 connect to a bias line Nbias 116. A sense amplifier enable PMOS transistor 118 connects node Pbias to the positive power supply voltage Vcc, and a sense amplifier enable NMOS transistor 120 connects node Nbias to ground (or negative power supply). Sense amplifier enable signals SAEP and SAEN drive the gate terminals of enable transistors 118 and 120 respectively. When enable signals SAEP and SAEN are asserted, the cross-coupled transistors in each sense amplifier 108 is connected to the power supply lines, thereby activating the sense amplifier. Bias nodes Pbias and Nbias and enable transistors 118 and 120 are typically shared by all 512 sense amplifiers 108 that reside in the region between a pair of arrays 100. Thus, each one of enable transistors 118 and 120 drives not only the large capacitive loading on a bias node (Pbias or Nbias), but also 512 bit lines. These transistor therefore tend to be very large devices with, for example, 512 µm wide channel for NMOS 120 and 1536 µm wide channel for PMOS 118.

Given 32 input/output (I/O) ports for the exemplary memory circuit, each region between a pair of memory arrays includes two pairs of I/O lines 122 and 124. Each pair of I/O lines is connected, via a pair of column decode transistors 126, to the sense nodes of half of 512 sense amplifiers 108 in an alternating fashion. The gate terminals of column decode transistors 126 are driven by column decode lines CD. One CD line separately connects the two I/O lines 122 and 124 to two sense amplifiers 108. In the exemplary 16 Meg RAM, there are a total of 256 separate CD lines, each normally responding to a separate column address.

In a write operation for a normal (not graphics) RAM, four bits are written into each selected array of memory via four I/O lines, two (122 and 124) on each side of a selected array 100. Eight nonadjacent arrays 100 of the 32 total arrays are selected. Therefore, a total of 32 bits are written per cycle for the exemplary (X32) part. This requires that a CD line connect each of the four I/O line pairs to a separate sense amplifier 108 that is connected via array select transistors 106 to an accessed memory cell. If data with polarity opposite to that which is already stored in the four accessed memory cells are to be written into the cells, the latched state of the sense amplifiers must be switched. Very large enable transistors 118 and 120 maintain Pbias node 114 very near Vcc and Nbias node 116 very near ground, respectively. Cross-coupled sense amplifier transistors 110 and 112 are large enough (e.g., 12 µm wide) that it takes, for example, 1 mA of crowbar current through each of the I/O line pairs (122, 124) and through column decode transistors 126 (e.g., 6 µm wide) to overpower one sense amplifier 108 and flip it into the opposite state. Crowbar current refers to the DC current drawn during the switching of the transistors in, for example an inverter, when both PMOS and NMOS devices are momentarily on. With four bits per memory array and eight selected arrays, the total crowbar current may therefore be as high as about 32 mA. This portion of the total write current, although significant, is acceptable.

When performing a block write in a video RAM, however, the crowbar portion of the total write current may reach as high as a quarter of an Ampere. That is because a video RAM allows writing the same data simultaneously into as many as, for example, eight memory cells (one byte) through each I/O terminal. Assuming the exemplary RAM discussed above were a video RAM, bit line pairs 102 in each array 100 would be subdivided into groups of eight. Several (e.g., five) of the most significant bits (MSBs) of the column address information are then used to select a group of eight bit line pairs 102. The data on the I/O lines has a very special function in block writable RAMs. Instead of carrying the information to be written, it carries the information that selects the bit line pair within the selected group of eight that is written into. The actual data to be written is typically pre-stored separately in a "color" register. Each one of the eight bits of a byte represents the enable or disable of one of the eight selected bit line pairs. During each cycle, any combination of the eight bit line pairs may be enabled (none, some or all).

A block write, therefore, allows asserting up to eight CD lines simultaneously. Thus, it is possible that a block write may require as many as 256 (8 bits×32 I/Os) sense amplifiers to switch state, each drawing 1 mA crowbar current. While this is the worst case situation, block writes into a video RAM may frequently cause current spikes of several hundred milliamps, adding up to a very significant and troublesome noise as well as increasing power consumption of the circuit.

One way to reduce the amount of write current is by decreasing the size of the sense amplifier cross-coupled transistors. This, however, requires decreasing the size of the column decode transistors to maintain the required balance between the transistor sizes for nondestructive read operation. As a result, there will be less read current which in turn increases the read access time. Decreasing transistor sizes is therefore not a viable solution.

There is therefore a need for an improved circuit arrangement in memory circuits such as video RAMs with reduced current requirements during block writes.

SUMMARY OF THE INVENTION

The present invention provides a circuit and a method for limiting write current during block writes in memory circuits such as video RAMs. Instead of sharing the Pbias and Nbias nodes of all of the sense amplifiers located between two memory sub-arrays, the circuit of the present invention divides these nodes into several disconnected segments. Each segment serves a subset of the total number of sense amplifiers and connects to a separate pair of sense amplifier enable transistors. This significantly reduces the capacitive loading on each individual Pbias and Nbias node and allows for smaller sized sense amplifier enable transistors. The smaller enable transistors are unable to maintain Nbias and Pbias at their respective power supply voltages during a block write. This results in lower gate-to-source voltages for the sense amplifier cross-coupled transistors during the block write operation. This in turn significantly reduces the amount of current required to overpower the sense amplifier and flip it into the opposite state.

Accordingly, in one embodiment, the present invention provides in a memory circuit wherein multiple storage elements can be simultaneously written via one input/output (I/O) terminal during a block write operation, and only one storage element can be read via one I/O terminal during a read operation, a block write current limiting circuit including: an I/O line and a group of sense amplifiers coupled to the I/O line via a corresponding group of column decode transistors, with each one of the sense amplifiers having a first bias node coupled to a first bias line and a second bias node coupled to a second bias line. One of the first and second bias lines is divided into a number of segments, with each segment coupled to a subset of the sense amplifiers. The circuit further includes a group of enable transistors each one coupling one segment of the segmented bias line to a first bias voltage, and an enable transistor coupling one the non-segmented bias line to a second bias voltage.

In another embodiment, the present invention provides in a memory circuit wherein multiple storage elements can be simultaneously written via one I/O terminal during a block write operation, and one storage element can be read via one I/O terminal during a read operation, a method for limiting write current during block writes including the steps of: (a) coupling a group of sense amplifiers to one I/O line via a corresponding group of decode transistors, each sense amplifier having a first bias node coupled to a first bias line and a second bias node coupled to a second bias line, (b) dividing at least one of the first and the second bias lines into multiple segments, with each segment coupled to a subset of the group of sense amplifiers, and (c) separately biasing each subset of the sense amplifiers by separately coupling each segment of a segmented bias line to a first bias node.

A better understanding of the nature and advantages of the current limiting circuit of the present invention may be had with reference to the following detailed description and the accompanying drawings.

DESCRIPTION OF SPECIFIC EMBODIMENTS

Figure 1:
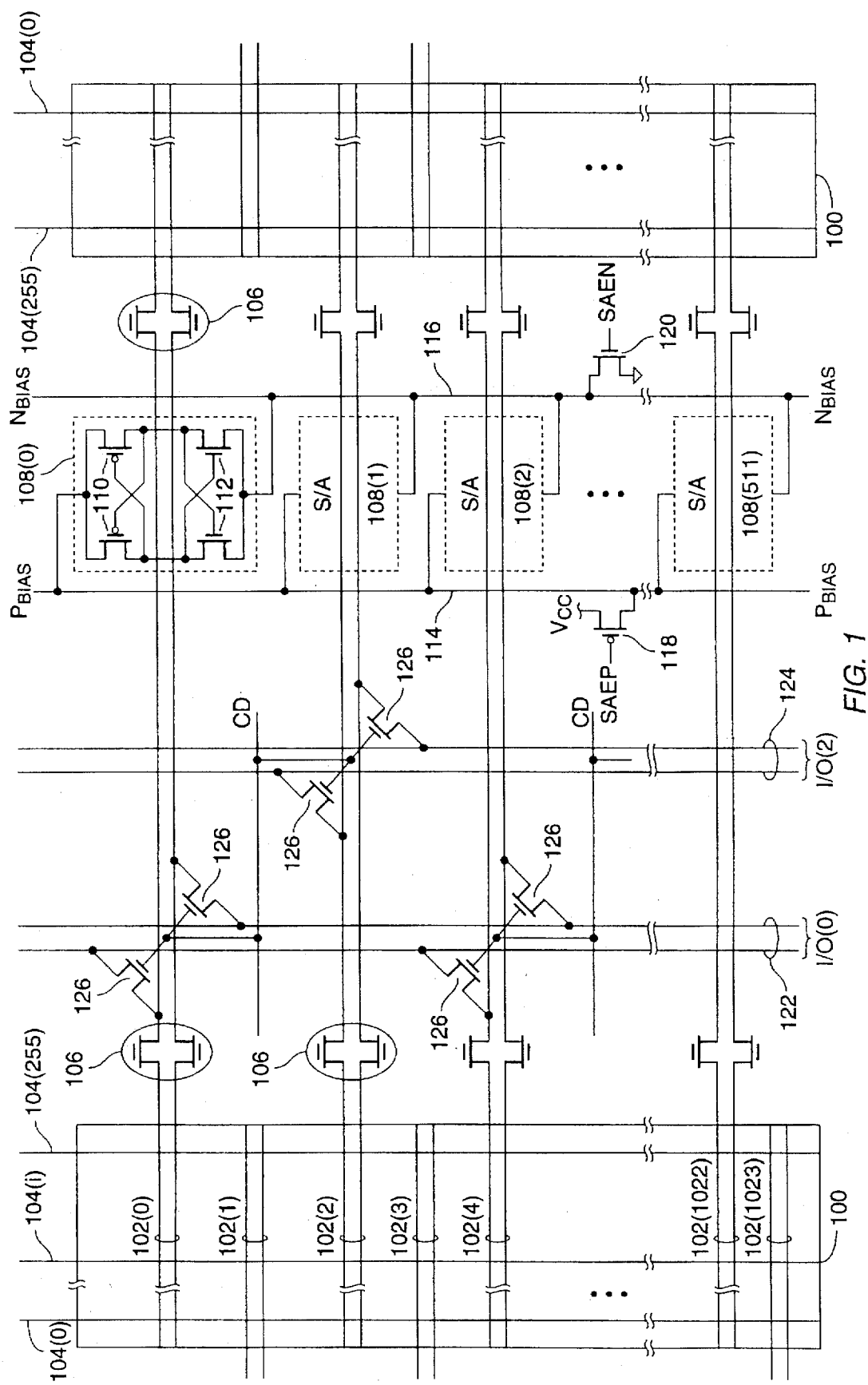
FIG. 1 is a partial circuit schematic showing two adjacent memory arrays in a multi-array memory integrated circuit and the circuitry therebetween.
Figure 2:
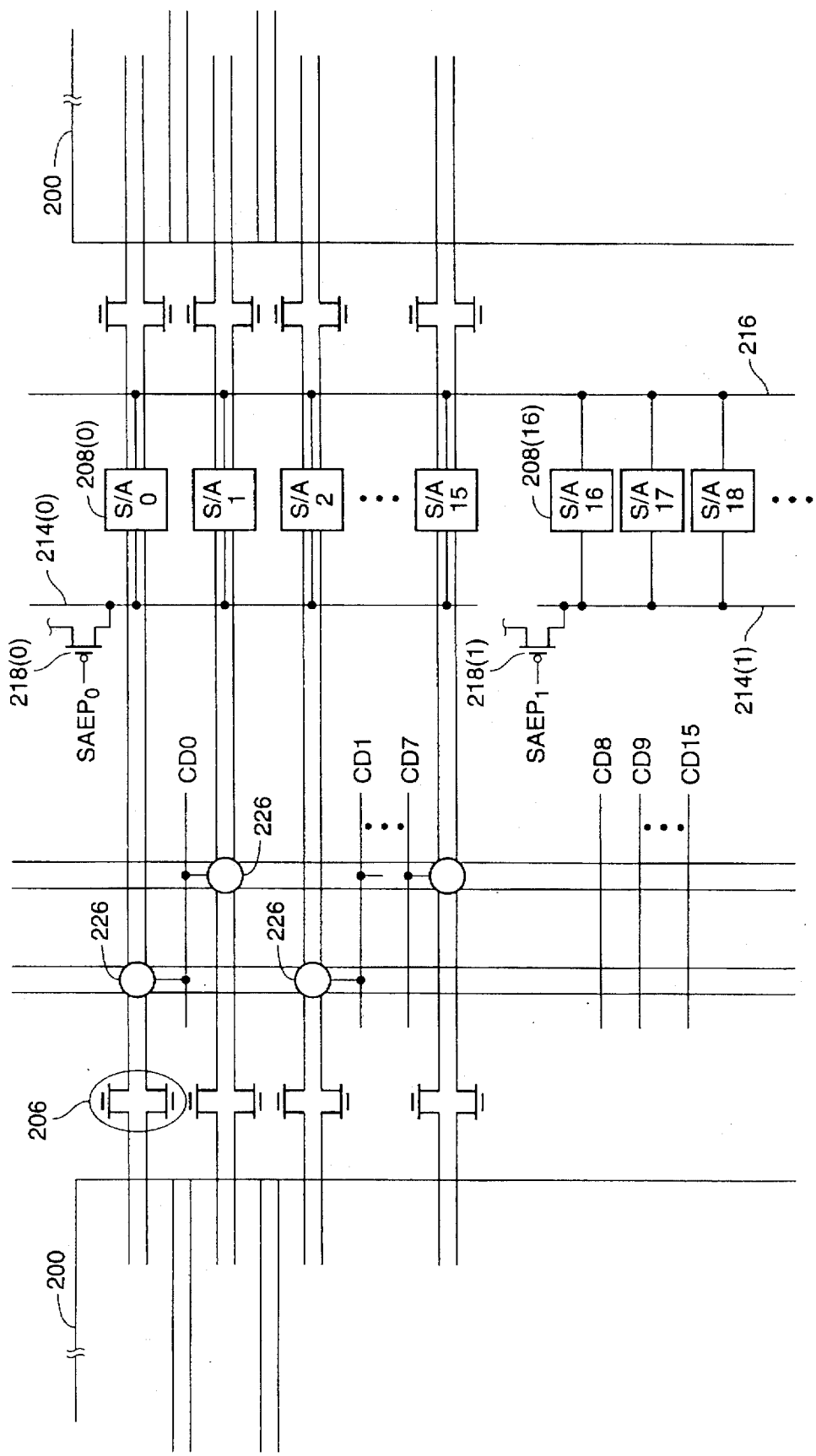
FIG. 2 is a circuit schematic showing one embodiment of the current limiting circuit during block write according to the present invention.
Figure 2:
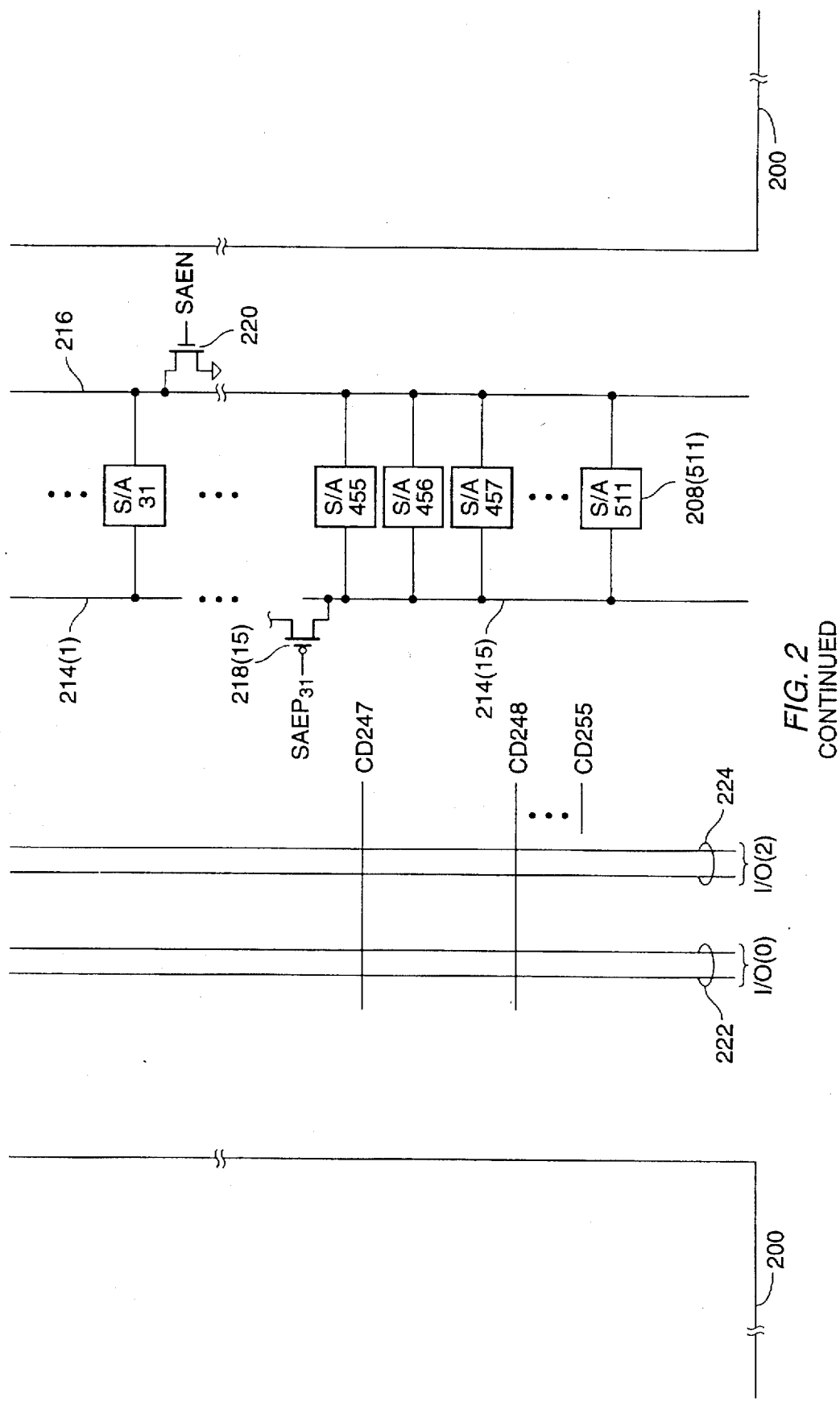

FIG. 2 is a partial circuit schematic showing two adjacent memory arrays in an exemplary multi-array memory integrated circuit according to one embodiment of the present invention. The circuit of FIG. 2 assumes the same memory organization as the exemplary 16 Meg RAM shown in FIG. 1 and described above. Two I/O lines 222 and 224 and 512 sense amplifiers 208 are shown in the region between two 256K memory arrays 200. Instead of a single Pbias line 214 connecting to all 512 sense amplifiers 208, the block write current limiting circuit shown in FIG. 2 divides the Pbias line into 32 electrically disconnected segments. Each segment includes eight preferably adjacent CD lines connecting 2 pairs of I/O lines 222 and 224 to 16 adjacent sense amplifiers 208 on either side of each array 200. Each segment includes a separate PMOS sense amplifier enable transistor 218 connecting the associated segment of Pbias line to Vcc. Thus, in this example, there are 32 PMOS enable transistors 218. The size of the PMOS enable transistor 218 can be 1/32 of the PMOS enable transistor 118 since the segmentation of the Pbias line reduces the effective load by a factor of 32. Using the exemplary transistor sizes of FIG. 1, PMOS enable transistor 218 would be 48 μm wide instead of 1536 μm. In the specific embodiment shown in FIG. 2, Nbias line 216 is not segmented and is therefore shared by all 512 sense amplifiers, with a single NMOS enable transistor 220 connecting it to ground. NMOS enable transistor 220 drives the same effective load as its counterpart in FIG. 1 and therefore has a 512 μm wide channel.

In performing a block write operation, the smaller (i.e., weaker) PMOS enable transistors 218 of the circuit of the present invention will no longer be able to maintain the voltage at their respective Pbias segments near Vcc. When writing opposite data, the voltage on the Pbias node starts to move down toward ground limiting the amount of crowbar current to that which can be supplied by the single smaller PMOS enable transistor 218. This current may be limited to, for example, 4 mA (i.e., four times the amount of current for a 12μ PMOS transistor). Each PMOS enable transistor 218 connects to 16 sense amplifiers 208, eight per each pair of I/O lines 222 and 224. With a total of 32 I/O lines, the circuit under the worst case situation, where all 256 bits are being written with opposite data, would draw 4 mA multiplied by 16, totaling only 64 mA of crowbar current. This is a 75% reduction in the total worst case crowbar current as compared to the circuit shown in FIG. 1. This reduction in write current, however, is obtained at the cost of a slight decrease in read current and thus an increase in the read cycle time.

Figure 3:
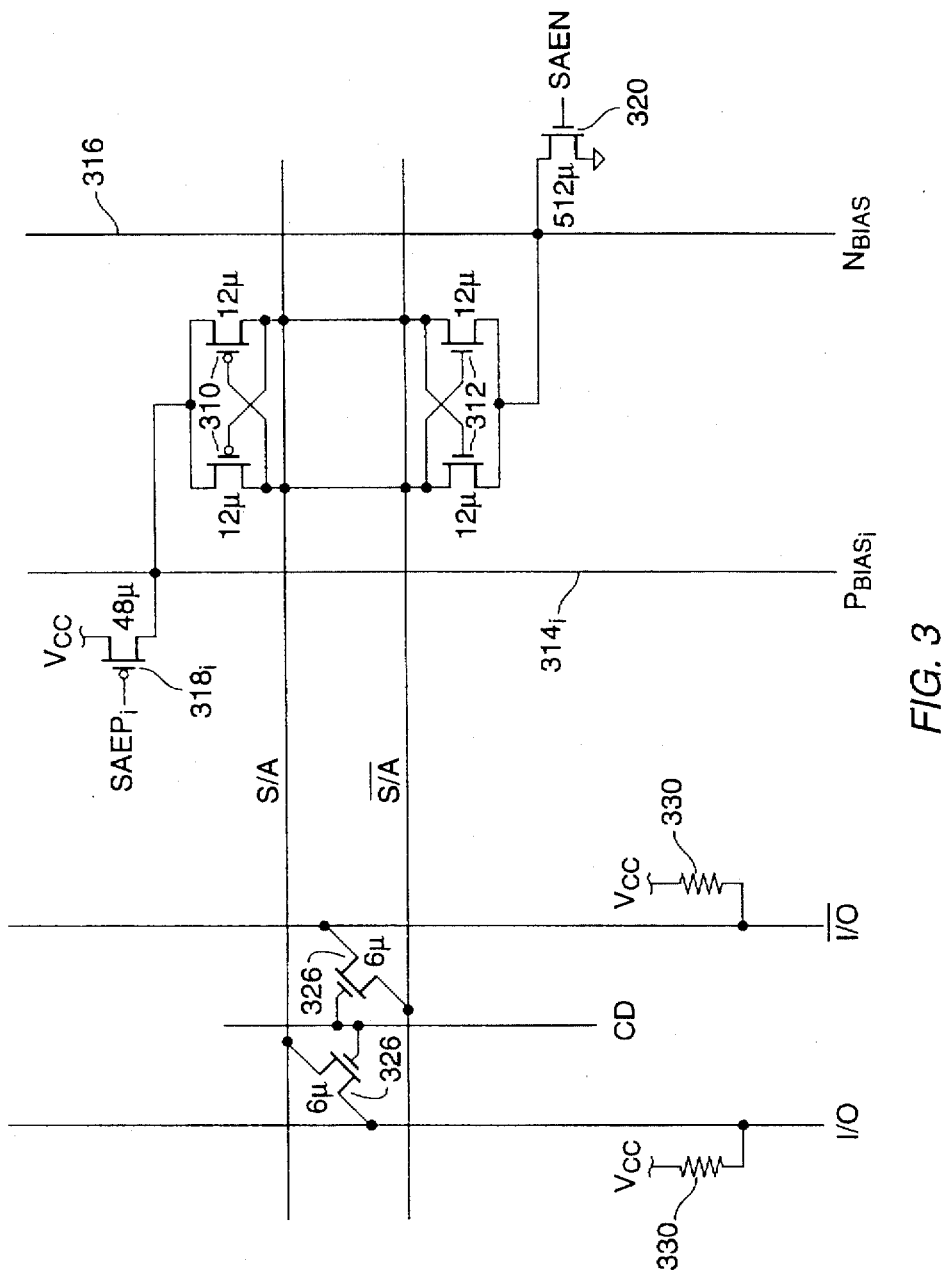
FIG. 3 shows in greater detail an example of the data path for a single I/O line in a RAM.

To better illustrate this drastic power savings during block writes as well as the impact on the read cycle, the operation of the circuit will be described in more detail in connection with FIG. 3. FIG. 3 shows the I/O path for one sense amplifier with exemplary transistor sizes for purposes of illustration only. Column decode transistors 326 are 6 μm wide NMOS transistors, cross-coupled transistors 310 and 312 inside the sense amplifier are 12 μm wide transistors, and NMOS enable transistor 320 is 512 μm wide as in the circuit shown in FIG. 1. The size of PMOS enable transistor 318, however, is reduced by a factor of 32 to 48 μm.

When writing data of opposite polarity, the data on the complementary pair of I/O lines must flip the state of the sense amplifier (or voltages on sense nodes S/A and $\overline{S/A}$) through 6 μm wide NMOS column decode transistors 326. The 6 μm wide column decode transistors 326 are clearly not strong enough to overpower the 12 μm wide NMOS cross-coupled transistors 312. But they are strong enough to overpower the 12 μm wide PMOS cross-coupled transistors 310. Thus, given the exemplary device sizes of FIG. 3, during a write operation it is generally the PMOS half of the sense amplifier that sustains the voltage drop and draws the crowbar current. In the case of the circuit shown in FIG. 1, where PMOS enable transistor 118 is very large (e.g., 1536 μm), node Pbias remains very near Vcc, and thus almost the entire voltage differential occurs across the cross-coupled PMOS transistors. It is the 12 μm wide cross-coupled transistors that supply the crowbar current. However, with a much smaller PMOS enable transistor $318_i$ (48 μm wide) as shown in FIG. 3, NMOS column decoder transistors 326 are able to move the voltage on node $Pbias_i$ down toward ground. Accordingly, it is PMOS enable transistor $318_i$ that sustains the voltage differential and thus limits the supply of the crowbar current. Since there are only 16 PMOS enable transistors 318 that are active during each block write (one for every 2 I/Os), the total crowbar current is limited to 16×4=64 mA for the exemplary x32 RAM.

Another embodiment of the present invention divides up the Nbias node in several independent segments as well, with each Nbias segment having a separate corresponding NMOS enable transistor that is much smaller in size compared to the single large NMOS enable transistor shown in FIG. 1. As mentioned above, when writing data of opposite polarity, it is the PMOS half of the sense amplifier that initiates the switchover and thus draws most of the crowbar current. However, segmenting the Nbias node allows the use of smaller and weaker NMOS enable transistors. Node Nbias is therefore not as strongly pulled to ground by the NMOS enable transistor. This in turn helps reduce the crowbar current somewhat by moving the voltage on node Nbias up toward Vcc and reducing the gate to source voltage across the NMOS cross-coupled pair 312. Therefore, while most of the current limiting is achieved by the smaller PMOS enable transistor, a smaller and weaker NMOS enable transistor also contributes to the current savings.

The drawback in terms of the reduction in read current is best understood by evaluating the total resistance of the I/O path. For a read operation, both of the complementary I/O lines are charged to Vcc by resistive elements 330. When a memory cell is accessed, one of the sense nodes of sense amplifier is pulled to ground and current flows through a corresponding resistive element 330, column decode transistor 326, NMOS cross-coupled transistor 312 and NMOS enable transistor 320. For a read operation therefore, it is essentially the NMOS half of the sense amplifier that sets the current and the speed. Thus, in the embodiment shown in FIG. 3 where Nbias is not segmented and NMOS enable transistor 320 is 512 μm wide as in the circuit shown in FIG. 1, the read current is not adversely affected. Considering the total resistance in this path and equating 24μ to one unit of resistance R to facilitate the analysis, the path for the embodiment shown in FIG. 3 exhibits approximately 6 units of resistance R: (6 μm wide NMOS transistor 326=4R)+(12 μm wide NMOS cross-coupled transistor 312=2R)+(512 μm wide NMOS enable transistor 320≈0R).

The second embodiment wherein the Nbias node is also segmented with a smaller NMOS enable transistor 320, exhibits a higher resistance. Given, for example, a 16 μm wide (512 μm divided by 32) NMOS enable transistor, the effective resistance of the enable transistor for a single I/O path would be approximately 3 units of resistance R. Since every 16 μm wide NMOS 320 is shared by two pairs of I/O lines, the width is divided by two (e.g., 8 μm) per I/O line, resulting in effective resistance of 3R. The total resistance is thus 9R for the second embodiment. There is therefore 6/9 or 2/3 as much read current in the second embodiment. This results in a longer read cycle.

In conclusion, the present invention provides a circuit and a method for limiting block write current in memory integrated circuits. The circuit achieves current limiting by dividing the normally shared sense amplifier bias nodes into several independent segments. Each segment is then biased using a separate sense amplifier enable transistor. The segmenting results in smaller capacitive load allowing the use of smaller and weaker enable transistors. This in turn limits the amount of crowbar current through the sense amplifiers when writing opposite polarity data. While the above is a complete description of specific embodiments of the present invention, various modifications, variations and alternatives may be employed. For example, the sense amplifier bias lines can be segmented, and the corresponding sense amplifiers grouped together, in a variety of combinations. The specific embodiments described grouped those sense amplifiers that are written together and that are adjacently placed. Other embodiments with longer segments and/or groupings of non-adjacent sense amplifiers are also possible. The scope of this invention, therefore, should not be limited to the embodiments described, and should instead be defined by the following claims.

What is claimed is:

1. A memory circuit comprising:
   a plurality of sense amplifiers disposed adjacent to each other on one side of an array of memory cells and sensing data from the same row of memory cells in said array at a given time,
   each one of said plurality of sense amplifiers having a first bias node coupled to a first bias line and a second bias node coupled to a second bias line, at least one of said first and second bias lines being divided into a plurality of separate segments, each segment of said plurality of separate segments being coupled to a subset of said plurality of sense amplifiers; and
   a first plurality of enable devices each one respectively coupling one segment of said plurality of separate segments to a first bias source.

2. The memory circuit of claim 1 wherein memory cells coupled to said subset of said plurality of sense amplifiers are simultaneously written during a block write operation.

3. The memory circuit of claim 2 wherein said subset of said plurality of sense amplifiers are adjacently disposed.

4. The memory circuit of claim 1 wherein each one of said plurality of sense amplifiers includes a P-channel cross-coupled pair of transistors coupled to said first bias node, and an N-channel cross-coupled pair of transistors coupled to said second bias node.

5. The memory circuit of claim 1 wherein said first bias line is segmented and wherein each of said first plurality of enable devices comprises a pass transistor coupling a respective segment of said first bias line to a first bias voltage.

6. The memory circuit of claim 5 wherein said second bias line couples to every one of said plurality of sense amplifiers, and wherein said memory circuit further comprises an enable device coupling said second bias line to a second bias voltage.

7. The memory circuit of claim 5 wherein said second bias line is also divided into a plurality of separate segments with each segment coupling to a subset of said plurality of sense amplifiers, and wherein said memory circuit further comprises a second plurality of enable devices respectively coupling each segment of said second bias line to a second bias voltage.

8. In a memory circuit, a method for limiting write current during a block write operation comprising the steps of:
   (a) disposing a plurality of sense amplifiers adjacent to each other on one side of an array of memory cells, said plurality of sense amplifiers sensing data from the same row of memory cells in said array at a given time, each sense amplifier having a first bias node coupled to a first bias line and a second bias node coupled to a second bias line;
   (b) dividing at least one of said first and second bias lines into a plurality of separate segments, each segment coupling to a subset of said plurality of sense amplifiers; and
   (c) separately biasing each subset of said plurality of amplifiers by separately coupling each segment of said plurality of separate segments to a bias line.

9. The method of claim 8 wherein said step of dividing divides said plurality of sense amplifiers into a plurality of subsets wherein memory cells coupled to each of which can be simultaneously written during a block write operation.

10. The method of claim 9 wherein each one of said plurality of subsets comprises adjacently disposed sense amplifiers.

11. A memory circuit comprising:
   a plurality of sense amplifiers adjacently disposed on one side of an array of memory cells and sensing data from the same row of memory cells in said array at a given time, each sense amplifier comprising a pair of PMOS transistors coupled to a pair of NMOS transistors, the pair of PMOS transistors have a common P terminal, and the pair of NMOS transistors have common N terminal;
   a first P-bias line coupled to the common P terminal of a first subset of the plurality of adjacently disposed sense amplifiers; and
   a second P-bias line coupled to the common P terminal of a second subset of the plurality of adjacently disposed sense amplifiers.

12. The memory circuit of claim 11 further comprising:
   a first enable transistor coupling the first P-bias line to a first reference node; and
   a second enable transistor coupling the second P-bias line to the first reference node.

13. The memory circuit of claim 12 further comprising:
   an N-bias line coupled to the common N terminal of the plurality of adjacently disposed sense amplifiers; and
   a third enable transistor coupling the N-bias line to a second reference node.

14. The memory circuit of claim 12 further comprising:
   a first N-bias line coupled to the common N terminal of the first subset of the plurality of adjacently disposed sense amplifiers; and
   a second N-bias line coupled to the common N terminal of the second subset of the plurality of adjacently disposed sense amplifiers.

15. The memory circuit of claim 14 further comprising:
   a third enable transistor coupling the first N-bias line to a second reference node; and
   a fourth enable transistor coupling the second N-bias line to the second reference node.

16. A memory circuit comprising:
   a first array of memory cells;
   a second array of memory cells;
   a plurality of sense amplifiers disposed between and shared by memory cells in the first and the second array, said plurality of sense amplifiers sensing data from the same row of memory cells in either one of said first or second array of memory cells, each sense amplifier comprising:
      a pair of PMOS transistors having a common P-bias terminal, and
      a pair of NMOS transistors coupled to the pair of PMOS transistors, and having a common N-bias terminal; and
   a first bias line divided into a plurality of separate segments, each segment coupling to the common P-bias terminals of an associated subset of the plurality of sense amplifiers.

17. The memory circuit of claim 16 further comprising a plurality of first enable transistors, each separately coupling one of the plurality of separate segments of the first bias line to a voltage source.

18. The memory circuit of claim 17 further comprising:
   a second bias line coupled to the common N-bias terminals of the plurality of sense amplifiers; and
   a second enable transistor coupling the second bias line to ground.

19. The memory circuit of claim 17 further comprising:
   a second bias line divided into a plurality of separate segments, each segment coupling to the common N-bias terminals of an associated subset of the plurality of sense amplifiers; and
   a plurality of second enable transistors, each separately coupling one of the plurality of separate segments of the second bias line to ground.

20. A memory circuit comprising:
   a plurality of sense amplifiers disposed adjacent to each other and each coupling to a plurality of memory cells, each one of said plurality of sense amplifiers having a first bias node coupled to a first bias line and a second bias node coupled to a second bias line, at least one of said first and second bias lines being divided into a plurality of separate segments, each segment of said plurality of separate segments being coupled to a subset of said plurality of sense amplifiers; and
   a first plurality of enable devices each one respectively coupling one segment of said plurality of separate segments to a first bias source,
   wherein said first bias line is segmented and wherein each of said first plurality of enable devices comprises a pass transistor coupling a respective segment of said first bias line to a first bias voltage, and
   wherein said second bias line couples to every one of said plurality of sense amplifiers, and wherein said memory circuit further comprises an enable device coupling said second bias line to a second bias voltage.

* * * * *